United States Patent
Schweitzer, III et al.

(10) Patent No.: US 9,843,335 B2
(45) Date of Patent: Dec. 12, 2017

(54) SUPERVISION OF INPUT SIGNAL CHANNELS

(71) Applicant: Schweitzer Engineering Laboratories, Inc., Pullman, WA (US)

(72) Inventors: Edmund O. Schweitzer, III, Pullman, WA (US); Veselin Skendzic, Schwenksville, PA (US); Tracey G. Windley, Moscow, ID (US); Bogdan Z. Kasztenny, Markham (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/391,521

(22) Filed: Dec. 27, 2016

(65) Prior Publication Data

US 2017/0187385 A1    Jun. 29, 2017

Related U.S. Application Data

(60) Provisional application No. 62/272,281, filed on Dec. 29, 2015.

(51) Int. Cl.
H03M 1/00 (2006.01)
H03M 1/06 (2006.01)
(Continued)

(52) U.S. Cl.
CPC ....... *H03M 1/0607* (2013.01); *H03M 1/1023* (2013.01); *H03M 1/12* (2013.01)

(58) Field of Classification Search
CPC ............. H03M 1/1019; H03M 1/1042; H03M 1/1057; H03M 1/1215; H03M 1/1255;
(Continued)

(56) References Cited

U.S. PATENT DOCUMENTS 4,276,605 A * 6/1981 Okamoto ............... H02H 3/044
324/511
4,402,028 A    8/1983 Udren
(Continued)

OTHER PUBLICATIONS

PCT/US2016/068787 International Search Report and Written Opinion of the International Searching Authority, dated Mar. 16, 2017.

*Primary Examiner* — Linh Nguyen
(74) *Attorney, Agent, or Firm* — Jared L. Cherry

(57) ABSTRACT

The present disclosure pertains to systems and methods for monitoring a plurality of analog-to-digital converters. In one embodiment, a plurality of input channels may each be in communication with a different phase of a three-phase electric power delivery system. The input channels may be configured to receive analog signals from the different phases. A composite signal subsystem may be configured to generate a composite signal based on the plurality of input channels. An analog-to-digital converter subsystem may be configured to produce a digitized representation of each of the plurality of input channels and a digitized representation of the composite signal. An analog-to-digital converter monitor subsystem may identify an error in the analog-to-digital conversion based on the digitized representation of the composite signal and the digitized representations of the plurality of input channels.

24 Claims, 6 Drawing Sheets

(51) Int. Cl.
 *H03M 1/10* (2006.01)
 *H03M 1/12* (2006.01)

(58) Field of Classification Search
 CPC ........ H03M 1/143; H03M 1/64; H03M 1/645;
  H03M 1/687; H03M 1/745; H03M 1/747;
  G01R 25/00; G01R 31/026; G01R
  15/125; G01R 13/0254; G01R 1/28;
  G01R 27/28; G01R 31/025; G01R
  31/3173
 USPC ......... 341/111–117, 141; 702/60, 67, 71, 75,
  702/70, 79; 324/601, 66.77, 76.79, 76.82
 See application file for complete search history.

(56) References Cited

U.S. PATENT DOCUMENTS

| | | | | |
|---|---|---|---|---|
| 4,599,640 A * | 7/1986 | Dischert | ................ | H04N 9/045 348/265 |
| 4,631,625 A | 12/1986 | Alexander | | |
| 4,713,608 A | 12/1987 | Catiller | | |
| 5,491,624 A * | 2/1996 | Levran | ................. | H02M 7/219 363/44 |
| 5,586,043 A * | 12/1996 | Breen | ................... | G01R 31/34 324/522 |
| 5,890,097 A * | 3/1999 | Cox | ................... | G01R 19/2513 324/76.11 |
| 6,147,616 A * | 11/2000 | Kim | ........................ | H02H 3/00 324/107 |
| 7,102,556 B2 * | 9/2006 | White | ................. | G01R 21/133 341/118 |
| 7,589,516 B2 * | 9/2009 | Rzehak | ................. | G01R 22/10 324/107 |
| 8,933,830 B1 | 1/2015 | Jeon | | |
| 9,046,585 B2 * | 6/2015 | Sugeno | ............. | G01R 31/3648 |
| 2004/0254687 A1 | 12/2004 | Whitehead | | |
| 2007/0182401 A1 * | 8/2007 | Driehorn | ............. | H02H 1/0007 324/127 |
| 2007/0189419 A1 | 8/2007 | Filipovic | | |
| 2010/0073831 A1 | 3/2010 | Schweitzer | | |
| 2010/0238060 A1 * | 9/2010 | Nien | ................... | H02M 3/1584 341/155 |
| 2011/0163900 A1 | 7/2011 | Pagnanelli | | |
| 2012/0010849 A1 * | 1/2012 | Yamada | ............. | G01D 5/2073 702/151 |
| 2013/0054165 A1 * | 2/2013 | Ramirez | ............. | G01R 22/061 702/62 |
| 2013/0080093 A1 * | 3/2013 | Yang | ................... | G01R 21/133 702/60 |

* cited by examiner

SUPERVISION OF INPUT SIGNAL CHANNELS

RELATED APPLICATION

The present application claims priority under 35 U.S.C. §119(e) to U.S. Provisional Patent Application No. 62/272,281, filed Dec. 29, 2015, and titled "SUPERVISION OF INPUT SIGNAL CHANNELS FOR ELECTRIC POWER PROTECTIVE DEVICES," which is incorporated herein by reference in its entirety.

TECHNICAL FIELD

This disclosure relates to monitoring input signals provided to an analog-to-digital converter, generating a signal based on the input signals, and confirming the output of the analog-to-digital converter using the generated signal. More particularly, but not exclusively, the principles of the present disclosure may be utilized in protective devices for electric power systems.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
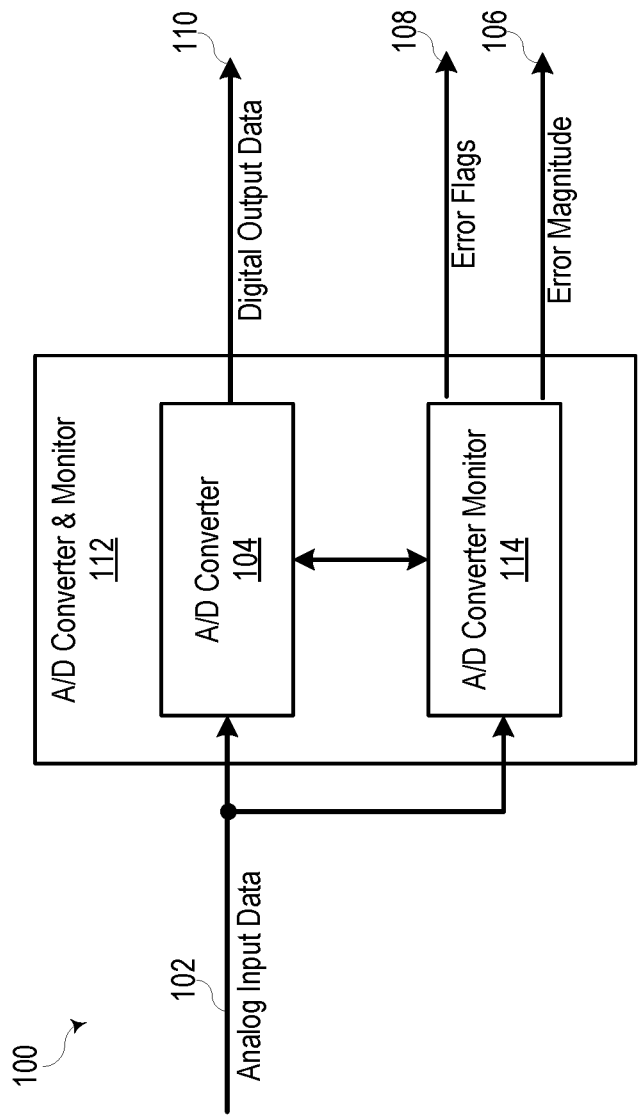
FIG. 1 illustrates a functional block diagram of a system comprising an A/D converter and an A/D converter monitor configured to monitor the operation of the A/D converter consistent with embodiments of the present disclosure.

This disclosure provides methods and systems to enable an intelligent electronic device (IED) to monitor signals from an analog to digital (A/D) converter and communicate an error signal if an error is detected. The systems and methods described herein monitor a number of input data channels by comparing an arithmetic combination of the channels against various thresholds.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor-executable instructions.

FIG. 1 illustrates a functional block diagram of a system 100 in which an A/D converter and monitor 112 is configured receive and convert analog input data 102 to digital output data 110 and generate an error magnitude 106 and error flags 108 consistent with embodiments of the present disclosure. The A/D converter and monitor 112 comprises an A/D converter 104 and an A/D converter monitor 114. The analog input data 102 may represent a wide variety of types of data. For example, the analog input data 102 may represent electrical signals in an electric power system, audio signals in a sound system, a rotational signal in a mechanical system, etc. In various embodiments, the input data 102 may include several channels of input signals. For example, the input data may include several current channels (such as, for example, one or more data channels from each of A, B, and C phases, and neutrals, one or more voltage channels, monitoring channels, and the like). Further, the input channels may include stereo audio signals provided to A/D converter 104. A/D converter 104 may be configured to generate digital output data 110 based on the analog input data 102. The digital output data 110 may be provided to other devices (not shown) for a variety of purposes.

The A/D converter monitor 114 may perform one or more of the monitoring techniques described herein to determine errors in the conversion of the analog input data 102 to the digital output data 110. The A/D converter monitor 114 may output error flags 108 when errors are detected. The A/D converter monitor 114 may further output an error magnitude 106 that represents a deviation between the digital output data 110 and the analog input data 102. In some embodiments, A/D converter monitor 114 may receive the analog input data 102 and the digital output data 110 and may use such data to monitor the operation of A/D converter 104. In some embodiments, the error magnitude 106 may represent an error determined over a period of time. In other embodiments, the error magnitude 106 may represent an error rate in relative terms (e.g., the magnitude may reflect that 10 or more of 100 digitized samples is inaccurate). The A/D converter monitor 114 may definite error limits based on hardware properties without relying on external information, such as runtime offset removal or factory calibration.

In various embodiments, the A/D converter monitor 114 may determine an error by generating a composite signal based on a plurality of input channels. Multiple A/D converters 104 may be used to measure a plurality of input channels (although a single A/D is illustrated, multiple A/Ds may be used). For example, in one particular application, system 100 may include three A/D converters 104, each of which is associated with one phase in a three-phase electric power system. The three inputs may be combined into a composite signal principle using an arithmetic operation. The composite signal may be selected to facilitate calculation. For example, the signals may be summed or multiplied in various combinations to create the composite signal. The particular function or functions utilized to generate the composite signal may be selected such that the composite signal is time-varying. For example, the combination of signals in a three-phase electrical power system, the sum of all of the phases is equal to 0. As such, in this particular application, other combinations of the input signals, such as those shown in Eqs. 1-4 may be utilized to obtain a time-varying composite signal.

$$\text{Composite Signal} = \frac{A + B - C}{4} \quad \text{Eq. 1}$$

$$\text{Composite Signal} = \frac{A + B - C}{2} \quad \text{Eq. 2}$$

$$\text{Composite Signal} = \frac{A + \frac{2B}{3} + \frac{C}{3}}{2} \quad \text{Eq. 3}$$

$$\text{Composite Signal} = \frac{-(A + B - C)}{4} \quad \text{Eq. 4}$$

In each of Eqs. 1-4, A, B, and C may each represent a signal from A, B, and C phases of an electric power system. Each of the signals from the A, B, and C phases impacts the composite signal, and as such, this single value may be used to monitor the three A/D converters 104 associated with each of the three signals.

In various embodiments, A/D converter 104 may either be physically integrated or physically separated from A/D converter monitor 114. In embodiments in which the A/D converter 104 is physically integrated with A/D converter monitor 114, the functionality described above for these elements may be implemented by a single a microprocessor, field-programmable gate array (FPGA), application specific integrated circuit (ASIC), or the like. Combining A/D converter 104 and A/D converter monitor 114 may, in some instances, reduce the costs of system 100 by reducing the number of components in the system. Alternatively, A/D converter monitor 114 may be distinct from A/D converter 104, and accordingly, the functionality described above for these elements may be implemented by separate microprocessors, FPGAs, or ASICs. Separation of A/D converter 104 from A/D converter monitor 114 may, in some instances, increase the reliability of system 100.

Figure 2:
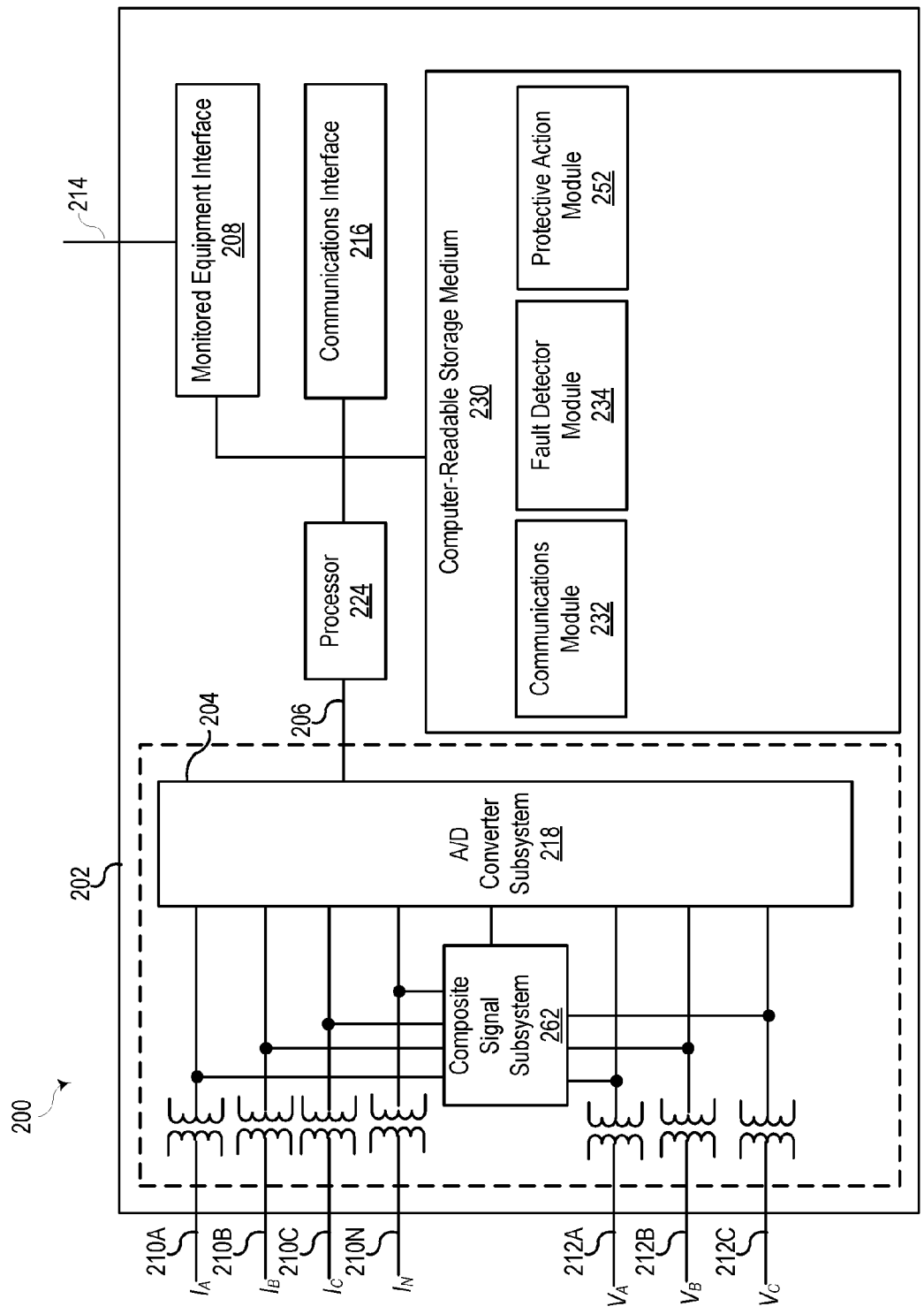
FIG. 2 illustrates a functional block diagram of a system that may be used to protect equipment of an electric power delivery system consistent with embodiments of the present disclosure.

FIG. 2 illustrates a functional block diagram of a system 200 that may be used to protect equipment of an electric power delivery system consistent with embodiments of the present disclosure. System 200 includes an IED 202 that is configured to receive a plurality of inputs 210 and 212 from the electric power delivery system (not shown). In the illustrated embodiment, IED 202 includes several current inputs IA 210A, IB 210B, IC 210C, IN 210N, which may correspond to A, B, and C phases of a three-phase electric power delivery system, and a neutral current of the three-phase electric power delivery system. IED 202 may also include several voltage inputs VA 212A, VB 212B, VC 212C, and the like from, for example, A, B, and C phases of a three-phase electric power delivery system. The input signals may be converted from analog to digital form in one or more analog-to-digital converter (A/D) subsystem 218. The A/D subsystem 218 may output digitized signals to a processor 224.

The processor 224 may be configured to execute instructions from a computer-readable storage medium 230. Processor 224 may operate using any number of processing rates and architectures. Processor 224 may be configured to perform various algorithms and calculations described herein. Processor 224 may be embodied as a general purpose integrated circuit, an application-specific integrated circuit, a field-programmable gate array, and/or any other suitable programmable logic device.

The processor 224 may be in communication with a monitored equipment interface 208 for interfacing with the monitored equipment. The monitored equipment may be, for example, a circuit breaker, tap changer, voltage regulator, switch, or the like. In various embodiments, the processor 224 may be configured to issue a control instruction to monitored equipment interface 208. The processor 224 may also be in communication with a communications interface 216 for communicating with other IEDs, a monitoring system such as a supervisory control and data acquisition (SCADA) system, or the like.

The IED also includes a composite signal subsystem 262. The composite signal subsystem 262 may be in electrical communication with the input signals 210 and 212. The composite signal subsystem 262 may be configured to generate one or more composite signals based on the input signals 210. The composite signal may be provided to A/D converter subsystem 218 for sampling and A/D conversion. A digitized version of the composite signal may be analyzed by the processor 224 to verify the operation of the A/D converter subsystem 218 and/or the input signals 210 and 212 to the A/D converter subsystem 218.

The processor may be configured to use the input signals 210 and 212 to perform one or more monitoring or protection functions for the electric power delivery system. For example, the input signals 210 and 212 may be associated with an electrical transmission line monitored by IED 202. Further, the input signals 210 and 212 may be associated with an electrical generator monitored by IED 202. In still other embodiments, the input signals 210 and 212 may be associated with other types of equipment in an electrical system.

The processor 224 may be configured to monitor the signals from the A/D converter subsystem 218 based on the composite signal generated by composite signal subsystem 262 and to generate an alarm if an error is detected. In some embodiments, an alarm may provide an indication that one or more of the A/D converters in A/D converter subsystem 218 has failed. In addition, or in the alternative, the composite signal may also be used as an indication of an issue with the input signals 210 and 212. For example, in the event that one of the input signals is disrupted, a corresponding change in the composite signal may be detected and error may be detected. In some embodiments, a signal corresponding to a magnitude of the error may also be determined.

A fault detector module 234 may be configured to analyze the digitized representations of the input signals 210 and 212 to detect a fault. A variety of types of fault detection techniques may be utilized to detect various types of faults, such as over-current conditions, over-voltage conditions, under-voltage conditions and the like.

A protective action module 252 may be configured to implement a protective action based on the declaration of a fault by the fault detector module 234. In various embodiments, a protective action may include tripping a breaker, selectively isolating a portion of the electric power system, etc. In various embodiments, the protective action module 252 may coordinate protective actions with other devices in communication with system 200. The protective action may be communicated via a monitored equipment interface 208 for implementation by an appropriate device.

In various embodiments, one or more digitized representations generated by A/D converter subsystem 218 may be invalidated based on the composite signal and/or an analysis of the composite signal. For example, certain digitized representations may be invalidated that are generated while an error flag is asserted. Invalidated digitized representations may be disregarded by fault detector module 234 and/or protective action module 252 for purposes of detecting faults and/or generating protective actions. In one embodiment, protective actions may be suppressed based on a difference between a digitized representation of the composite signal from an expected value.

Figure 3A:
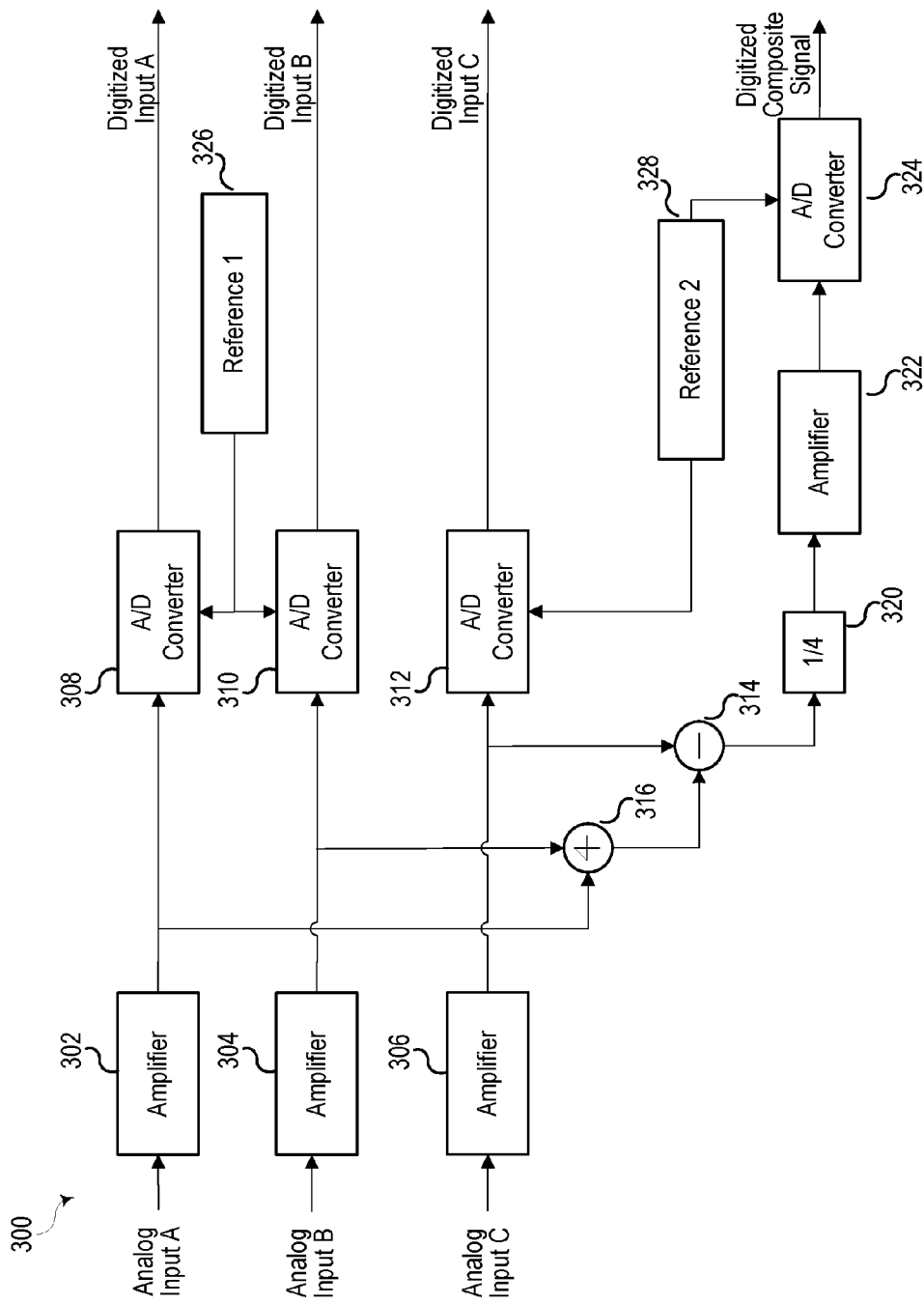
FIG. 3A illustrates a logic diagram of a system configured to detect errors of a plurality of digitized inputs consistent with embodiments of the present disclosure.

FIG. 3A illustrates a block diagram of a system 300 configured to receive analog inputs, to create a composite signal, and to generate digitized representations of the analog inputs and the composite signal consistent with embodiments of the present disclosure. A plurality of amplifiers 302, 304, and 306 may be configured to receive analog inputs A, B, and C, respectively. In some embodiments, the input signals A, B, and C, may correspond to the A, B, and C phase signals in an electric power system. The outputs of the amplifiers 302, 304, and 306 may be provided to A/D converters 308, 310, and 312, respectively. The outputs of A/D converters 308, 310, and 312 may be configured to generate digitized representations of input A, input B, and input C.

A first reference value 326 may be provided to A/D converters 308 and 310, while a second reference value 328 may be provided to A/D converters 312 and 324. The first reference value 326 and the second reference value 328 may comprise analog reference voltage values used by A/D converters 308, 310 and 312, 324, respectively. If the reference values 326, 328 are compromised, the outputs of A/D converters 308, 310 and 312, 324 are affected. It may be difficult to detect inaccurate reference values. Accordingly, the illustrated embodiment includes two reference values. The likelihood of both references failing simultaneously is remote. The failure of either reference value, however, will affect the composite signal, thus permitting detection of the failure.

The outputs of amplifiers 302, 304, and 306 may be combined to create a composite signal. The composite signal may be created as by adder 316, subtractor 314 and divider 320. Specifically, the composite signal may comprise the sum of analog input A and analog input B, minus analog input C, divided by 4 (i.e., the composite signal shown in Eq. 3). The composite signal may be an input to amplifier 322, which may be digitized by A/D converter 324. The output of A/D converter 324 may be configured to generate a digitized representation of the composite signal.

Figure 3B:
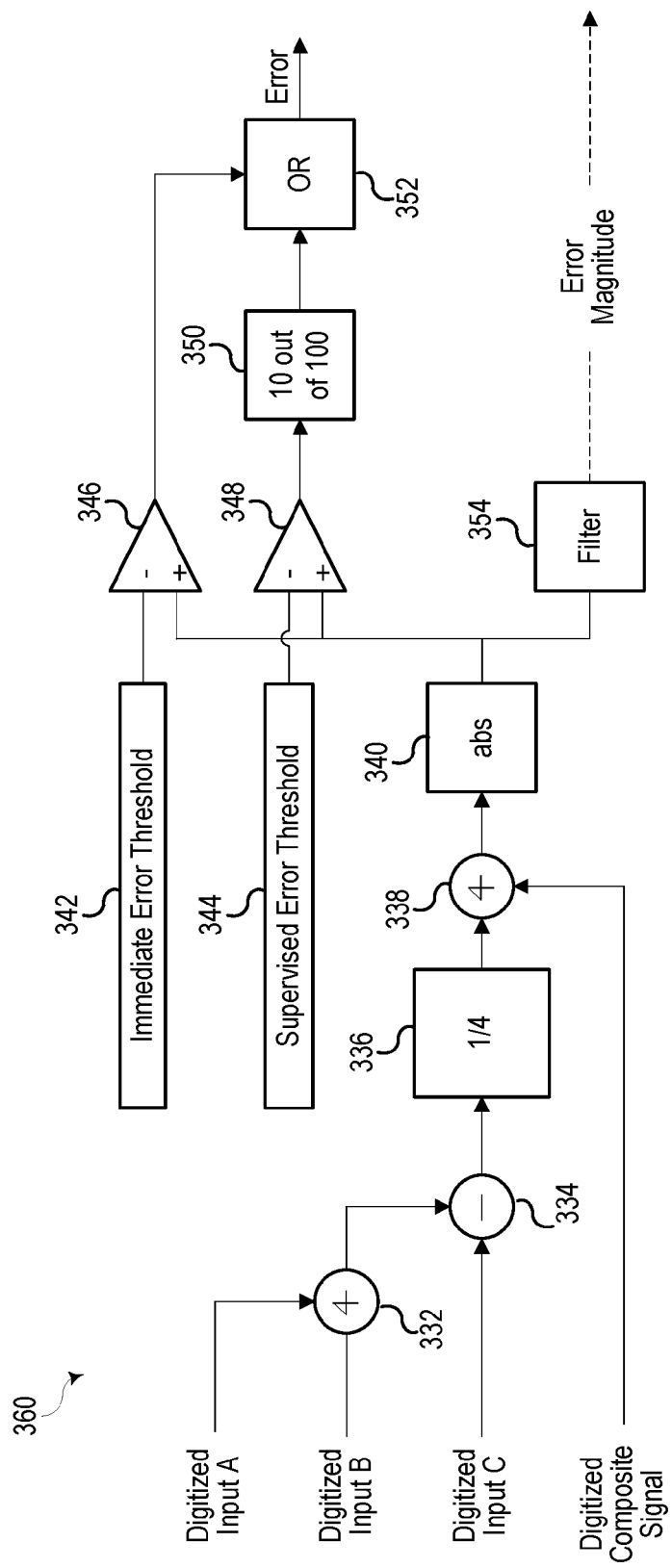
FIG. 3B illustrates a logic diagram of a system configured to detect errors of a plurality of digitized inputs consistent with embodiments of the present disclosure.

FIG. 3B illustrates a logic diagram of a system 360 configured to detect errors in a plurality of digitized input signals A, B, and C, consistent with embodiments of the present disclosure. In various embodiments, the digitized inputs may be received from system 300, as illustrated in FIG. 3A. More specifically, the values of the A and B inputs are summed by adder 302, the value of the C input is subtracted by subtractor 304, and the result is divided by divider 306.

System 360 may combine the digitized inputs A, B, and C as shown in Eq. 3 using adder 332, subtractor 334, and divider 336. Adder 338 may add the quotient generated by divider 336 to the digitized representation of the composite signal. An absolute value of the resulting sum may be determined at 340 and may be compared to an immediate error threshold 342 and a supervised error threshold 344 by comparators 346 and 348, respectively. In some embodiments, the immediate error threshold 342 may be selected to identify significant deviations, while the supervised error threshold 344 may be selected to identify smaller deviations that occur a specified number of times within a given number of samples.

The output of comparator 348 may be provided to a threshold level detector 350 configured to determine when the supervised error threshold 344 has been exceeded a specified number of occurrences in a specified number of samples or within a specified window of time. In the illustrated embodiment, the threshold is 10 samples out of 100 samples. This threshold may be selected based on various characteristics, such as the noise in the incoming signal, the needed precision for the digitized signal, etc. In one particular embodiment, the immediate threshold may be around 6.25% or $\frac{1}{16}$ of the full scale of the output of the A/D, while the supervised error threshold may be around 1.5625% or $\frac{1}{64}$ of the full scale of the output of the A/D. The outputs of comparator 346 and immediate error threshold 342 may be provided to an OR gate 352, the output of which may be asserted to identify an error condition.

The absolute value of the inputs may also be filtered and provided to a central processing unit. In some embodiments, the output of filter 354 may be provided to another system for analysis. In other embodiments, the output of filter 354 may be used for other types of analysis.

Figure 4:
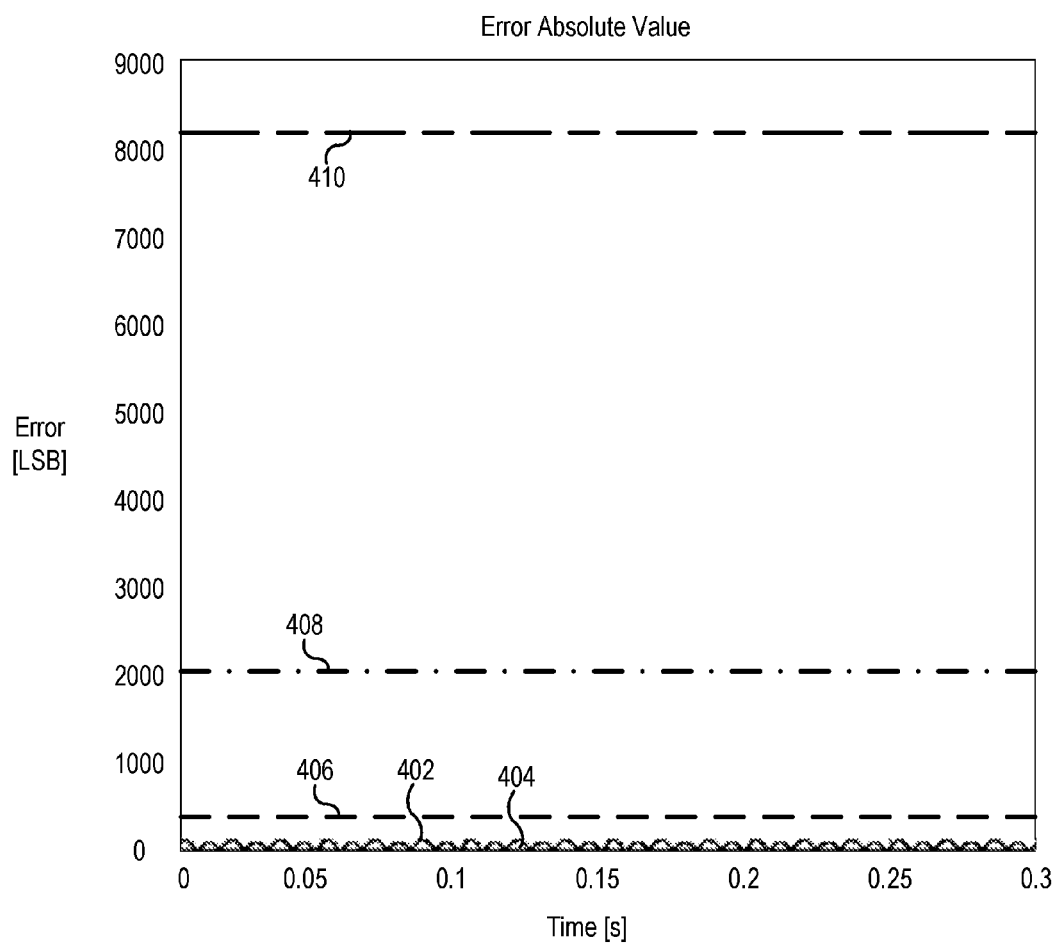
FIG. 4 illustrates a plot of error and input signals over time consistent with embodiments of the present disclosure.

FIG. 4 illustrates a plot of a filtered error input over time consistent with embodiments of the present disclosure. The signal 402 may reflect the magnitude of a voltage signal. Signal 404 may reflect the magnitude of an error signal. In one specific embodiment, the error signal 404 may correspond to the output of block 340 in FIG. 3B. In the event of an error, signal 404 may increases. An error flag may be generated when signal 404 exceeds one or more of thresholds 406, 408, and 410.

A plurality of thresholds 406, 408, and 410 are also illustrated in FIG. 4. Threshold 406 may represent a maximum expected hardware error. The hardware error threshold may be stated, for example, by the manufacturer of a specific A/D converter used to implement a system consistent with the present disclosure. Threshold 408 may represent an error rate in relative terms, namely an error of 10 out of 100 samples. Threshold 408 may correspond to the threshold level detector 350 illustrated in FIG. 3B. Finally, threshold 410 may represent an immediate error threshold. Threshold 410 may correspond to the immediate error threshold 342 illustrated in FIG. 3B. The thresholds 406, 408 and 410 exceed the input signals 402 and 404, and as such, no error is detected.

Figure 5:
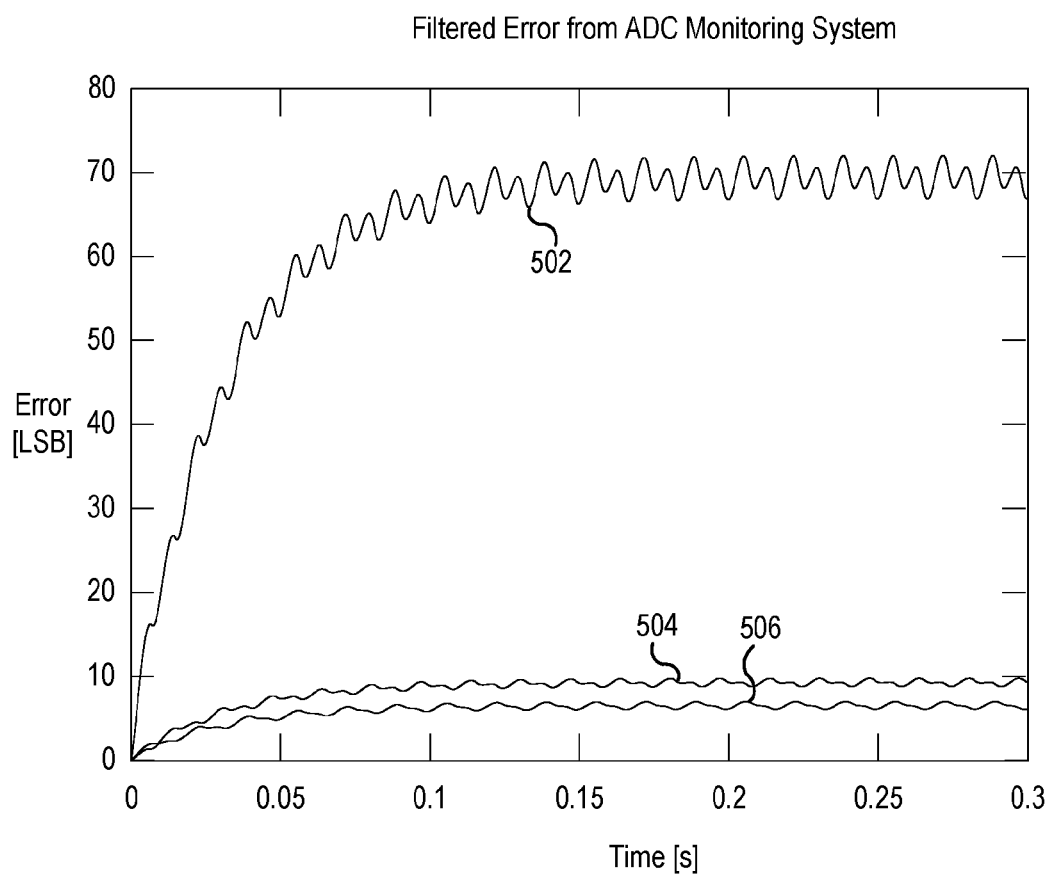
FIG. 5 illustrates a plot of a filtered error input over time consistent with embodiments of the present disclosure.

FIG. 5 illustrates a plot of the filtered error from an A/D converter monitoring system that may be provided to a CPU consistent with embodiments of the present disclosure. The plot shown in FIG. 5 includes a filtered error value 502 associated with a voltage signal and filtered error values 504 and 506 associated with current signals that may be provided to a CPU. In various embodiments, the filter may comprise a low pass filter. In various embodiments, the magnitude of an error signal may be proportional to the magnitude of the inputs. In other words, larger input signals may generate a larger error signal and a larger standing error signals, even if the system is operating as expected. Accordingly, in various embodiments, the thresholds may also be proportional to the magnitude of the input signals. As shown in FIG. 5, the filtered error values initially increase and then reach a stable level. The standing filtered error may derive from component tolerances, noise, or other factors.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system configured to monitor a plurality of analog-to-digital converters, comprising:
    a plurality of input channels, each in communication with a different phase of a three-phase electric power delivery system, and configured to receive a plurality of analog signals from the three phases;
    a composite signal subsystem configured to generate a composite signal based on the plurality of input channels;
    an analog-to-digital converter subsystem in communication with the plurality of input channels and the composite signal subsystem, the analog-to-digital converter subsystem configured to produce a digitized representation of each of the plurality of input channels and a first digitized representation of the composite signal; and
    a monitor subsystem in communication with the analog-to-digital converter subsystem and configured to identify at least one error in the digitized representation of at least one of the plurality of input channels produced by the analog-to-digital converter subsystem and based on the digitized representation of the composite signal and the digitized representations of the plurality of input channels.

2. The system of claim 1, wherein the composite signal comprises a time-varying combination of the plurality of analog signals.

3. The system of claim 1, wherein the composite signal comprises an arithmetic combination of the plurality of analog signals.

4. The system of claim 1, wherein the monitor subsystem is further configured to create a second digitized representation of the composite signal based on the digitized representations of the plurality of input channels, and to identify the error based on a comparison of the first digitized representation of the composite signal and the second digitized representation of the composite signal.

5. The system of claim 4, wherein the monitor subsystem is further configured to provide a representation of a magnitude of the at least one error.

6. The system of claim 5, wherein the magnitude of the at least one error is based on the first digitized representation of the composite signal and the second digitized representation of the composite signal.

7. The system of claim 5, wherein the representation of the magnitude comprises an output of a low pass filter.

8. The system of claim 1, wherein the monitor subsystem is further configured to identify the at least one error based on a combination of the digitized representation of the composite signal and the digitized representations of the plurality of input channels exceeding an immediate error threshold.

9. The system of claim 1, wherein the monitor subsystem is further configured to identify the at least one error based on a combination of the digitized representation of the composite signal and the digitized representations of the plurality of input channels exceeding a supervised error threshold a plurality of times in a specified window.

10. The system of claim 1, wherein the analog-to-digital converter subsystem comprises a plurality of analog-to-digital converters, and each of the plurality of input channels is associated with a corresponding analog-to-digital converter.

11. The system of claim 10, wherein the monitor subsystem is further configured to determine operation of each of the plurality of analog-to-digital converters associated with the plurality of input channels based on the composite signal.

12. The system of claim 1, wherein the monitor subsystem is further configured to invalidate the digitized representation based on the at least one error.

13. The system of claim 1, further comprising:
a monitored equipment interface configured to issue a control instruction to a piece of monitored equipment; and
a protection action subsystem configured to generate the control instruction based on the digitized representation of each of the plurality of input channels.

14. The system of claim 13, wherein the protection action subsystem is in communication with the monitor subsystem and is configured to suppress the control instruction based on the at least one error.

15. The system of claim 1, wherein the plurality of input channels are associated with one of a corresponding plurality of voltage signals and a corresponding plurality of current signals.

16. The system of claim 1, wherein the composite signal differs from each of the three phases.

17. A system configured to monitor a plurality of analog-to-digital converters, comprising:
a plurality of input channels configured to receive a plurality of analog signals from the different phases;
a composite signal subsystem configured to generate a composite signal based on the plurality of input channels;
an analog-to-digital converter subsystem in communication with the plurality of input channels and the composite signal subsystem, the analog-to-digital converter subsystem configured to produce a digitized representation of each of the plurality of input channels and a first digitized representation of the composite signal; and
a monitor subsystem in communication with the analog-to-digital converter subsystem and configured to identify at least one error in the digitized representation of at least one of the plurality of input channels produced by the analog-to-digital converter subsystem and based on the digitized representation of the composite signal and the digitized representations of the plurality of input channels.

18. The system of claim 17, wherein the composite signal comprises a time-varying combination of the plurality of analog signals.

19. A system configured to monitor a plurality of analog-to-digital converters, comprising:
a plurality of input channels configured to receive a plurality of analog signals from the different phases;
a composite signal subsystem configured to generate a composite signal based on the plurality of input channels;
an analog-to-digital converter subsystem in communication with the plurality of input channels and the composite signal subsystem, the analog-to-digital converter subsystem configured to produce a digitized representation of each of the plurality of input channels and a first digitized representation of the composite signal; and
a monitor subsystem in communication with the analog-to-digital converter subsystem and configured to identify at least one error based on the digitized representation of the composite signal and the digitized representations of the plurality of input channels;
wherein the monitor subsystem is further configured to create a second digitized representation of the composite signal based on the digitized representations of the plurality of input channels, and to identify the error based on a comparison of the first digitized representation of the composite signal and the second digitized representation of the composite signal.

20. The system of claim 17, wherein the monitor subsystem is further configured to provide a representation of a magnitude of the at least one error.

21. The system of claim 17, wherein the monitor subsystem is further configured to identify the at least one error based on a combination of the digitized representation of the composite signal and the digitized representations of the plurality of input channels exceeding an immediate error threshold.

22. The system of claim 17, wherein the monitor subsystem is further configured to identify the at least one error based on a combination of the digitized representation of the composite signal and the digitized representations of the plurality of input channels exceeding a supervised error threshold a plurality of times in a specified window.

23. The system of claim 1, wherein the analog-to-digital converter subsystem further comprises:
a plurality of analog-to-digital converters corresponding to the plurality of input channels and configured to produce a digitized representation of each of the plurality of input channels.

24. The system of claim 23, wherein the analog-to-digital converter subsystem further comprises:
an analog-to-digital converter configured to generate a digitized representation of the composite signal.

* * * * *